United States Patent
Bolster, Jr. et al.

(10) Patent No.: US 10,353,034 B2
(45) Date of Patent: Jul. 16, 2019

(54) MULTI-ECHO PSEUDO-GOLDEN ANGLE STACK OF STARS THERMOMETRY WITH HIGH SPATIAL AND TEMPORAL RESOLUTION USING K-SPACE WEIGHTED IMAGE CONTRAST

(71) Applicants: Siemens Healthcare GmbH, Erlangen (DE); University of Utah Research Foundation, Salt Lake City, UT (US)

(72) Inventors: Bradley Drake Bolster, Jr., Rochester, MN (US); Dennis L. Parker, Centerville, UT (US); Allison Payne, Salt Lake City, UT (US); Bryant Svedin, West Jordan, UT (US)

(73) Assignees: Siemens Healthcare GmbH, Erlangen (DE); University of Utah Research Foundation, Salt Lake City, UT (US)

( * ) Notice: Subject to any disclaimer, the term of this patent is extended or adjusted under 35 U.S.C. 154(b) by 177 days.

(21) Appl. No.: 15/463,122

(22) Filed: Mar. 20, 2017

(65) Prior Publication Data

US 2017/0322274 A1    Nov. 9, 2017

Related U.S. Application Data

(60) Provisional application No. 62/332,362, filed on May 5, 2016.

(51) Int. Cl.
| | |
|---|---|
| *G01V 3/00* | (2006.01) |
| *G01R 33/48* | (2006.01) |
| *G01R 33/561* | (2006.01) |
| *G01R 33/24* | (2006.01) |
| *G01R 33/50* | (2006.01) |

(52) U.S. Cl.
CPC ..... *G01R 33/4804* (2013.01); *G01R 33/5615* (2013.01); *G01R 33/243* (2013.01); *G01R 33/4826* (2013.01); *G01R 33/4828* (2013.01); *G01R 33/50* (2013.01); *G01R 33/5619* (2013.01)

(58) Field of Classification Search
USPC ....................................... 324/312
See application file for complete search history.

(56) References Cited

U.S. PATENT DOCUMENTS

| | | | | |
|---|---|---|---|---|
| 6,528,996 B1 * | 3/2003 | Sato | ................. | G01R 33/56341 324/307 |
| 7,148,685 B2 * | 12/2006 | Block | ................. | G01R 33/4828 324/307 |

(Continued)

OTHER PUBLICATIONS

Svedin, Bryant T., Allison Payne, and Dennis L. Parker. "Respiration artifact correction in three-dimensional proton resonance frequency MR thermometry using phase navigators." Magnetic resonance in medicine (2015).

(Continued)

*Primary Examiner* — Rodney E Fuller

(57) ABSTRACT

A method for producing an image of a subject using a magnetic resonance imaging (MRI) system includes acquiring a series of echo signals by sampling k-space along radial lines that each pass through the center of k-space. Each projection of the radial lines is divided into multiple echoes and successive projections are spaced by a predetermined angular distance. The series of echo signals are reconstructed into a plurality of images, wherein each image corresponds to a distinct echo signal.

19 Claims, 16 Drawing Sheets

(56) References Cited

U.S. PATENT DOCUMENTS

| | | | | |
|---|---|---|---|---|
| 2007/0080685 A1* | 4/2007 | Bydder | ............... | G01R 33/561 |
| | | | | 324/309 |
| 2012/0256625 A1* | 10/2012 | Block | ............... | G01R 33/4828 |
| | | | | 324/309 |
| 2015/0309148 A1* | 10/2015 | Hardy | ............... | G01R 33/4826 |
| | | | | 324/309 |
| 2017/0030986 A1* | 2/2017 | James | ............... | G01R 33/4818 |
| 2017/0261584 A1* | 9/2017 | James | .................... | A61B 5/055 |
| 2018/0149721 A1* | 5/2018 | Beck | ................ | G01R 33/4826 |

OTHER PUBLICATIONS

Song, Hee Kwon, and Lawrence Dougherty. "k-Space weighted image contrast (KWIC) for contrast manipulation in projection reconstruction MRI." Magnetic resonance in medicine 44.6 (2000): 825-832.

Winkelmann S. et al; "An Optimal Radial Profile Order Based on the Golden Ratio for Time-Resolved MRI"; IEEE Transactions on Medical Imaging 2007; vol. 26; No. 1; pp. 68-76.

Block, K.T., and M. Uecker. "Simple method for adaptive gradient-delay compensation in radial MRI." Proceedings of the 19th Annual Meeting of ISMRM, Montreal, Canada. 2011.

Baron, Paul, et al. "In vivo T2-based MR thermometry in adipose tissue layers for high-intensity focused ultrasound near-field monitoring." Magnetic resonance in medicine 72.4 (2014): 1057-1064.

P.B. Roemer et al: "The NMR Phased Array", Magnetic Resonance in Medicine 16, pp. 192-225, 1990.

\* cited by examiner

MULTI-ECHO PSEUDO-GOLDEN ANGLE STACK OF STARS THERMOMETRY WITH HIGH SPATIAL AND TEMPORAL RESOLUTION USING K-SPACE WEIGHTED IMAGE CONTRAST

CROSS-REFERENCE TO RELATED APPLICATIONS

This application claims the benefit of U.S. Provisional Application Ser. No. 62/332,362 filed May 5, 2016, which is incorporated herein by reference in its entirety.

GOVERNMENT INTERESTS

This invention was made with government support under grant R01 CA172787 awarded by The National Institutes of Health. The government has certain rights in the invention.

TECHNOLOGY FIELD

The present invention relates generally to methods, systems, and apparatuses for performing Magnetic Resonance Imaging (MRI) using 3D multi-echo stack-of-stars radial acquisitions. The disclosed techniques may be applied to, for example temperature measurements.

BACKGROUND

Magnetic resonance (MR) imaging provides excellent soft tissue contrast and when used to guide focused ultrasound (FUS), providing the ability to localize, plan, monitor and verify treatments. FUS has been used to non-invasively treat uterine fibroids as well as breast, prostate, liver and brain cancer. As FUS can deliver large amounts of energy over a short time interval, the monitoring of treatments requires a high temporal resolution. Also, because the energy is delivered from a large transducer aperture to a small focus, a large field of view is required to monitor any possible energy deposition. The FUS beam will likely travel through several different tissue types during treatment where a portion of the beam will be reflected and transmitted at each tissue interface depending on the impedance difference between the tissues. Each tissue type will also absorb a different amount of the ultrasound energy. For example, 90% of the ultrasound energy through the skull is reflected or absorbed.

Monitoring of interventional treatments can be done using 2D or 3D MRI sequences where the method chosen is often governed by the trade-off between the needed temporal and spatial resolution and required field of view. Currently, clinical monitoring of MR guided FUS (MRgFUS) treatments is limited to a single (or relatively few) 2D slices providing a limited field of view. For example, 2D monitoring of the ultrasound focus during transcranial MRgFUS treatments cannot measure any heating near the skull surface, and will miss any unintended energy deposition due to beam aberration, or near field grating lobes.

MR temperature imaging does have some limitations, which are more apparent when using 2D imaging. Partial volume effects cause an underestimation of the actual temperature, which will increase with voxel size. It can also be difficult to properly position a single 2D slice to capture the entire focus. Multiple 2D slices will have a gap between each slice, meaning any temperature increase in the gap will not be measured. Respiration and motion artifacts will also introduce errors to the temperature monitoring.

3D MR thermometry can overcome many of the field of view, partial volume, and coverage gap limitations, which are inherent in 2D imaging but unfortunately, standard 3D sequences typically require too much time to acquire k-space to be clinically viable. Temporal resolution can be increased by methods involving undersampling such as temporally constrained reconstruction, model predictive filtering, Kalman filtering, parallel imaging or using a sequence designed for increased speed such as segmented echo-planar imaging (seg-EPI).

While a 3D seg-EPI offers several advantages, it has limitations. The chemical shift artifact, field inhomogeneity, and field variation due to motion artifacts are increased due to the low bandwidth in the phase encoding direction. The chemical shift typically requires imaging with fat saturation, while the respiration artifact can be corrected to a limited extent depending on the orientation of the 3D slab. Increasing the EPI factor, or number of lines collected per TR, will increase the temporal resolution while further escalating the chemical shift and respiration artifacts and decreasing the signal to noise ratio (SNR). Seg-EPI sequences also typically have image distortions along the phase encode direction.

Non-Cartesian 3D sequences, such as stack of stars and stack of spirals, have several advantages. Projection sampling performs well with high levels of undersampling. The center of k-space is sampled every TR providing robustness to motion, as well as the ability to correct respiration artifacts through self-navigation. Using a golden angle (GA) increment improves the ability for angular undersampling, as a GA increment guarantees an optimal projection angle distribution for an arbitrary number of projection angles, and the irrational nature of the GA also lends itself to compressed sensing. The GA is also an optimal radial projection order when using k-space weighted image contrast (KWIC) to increase the temporal resolution. Combining radial sampling with Cartesian slice encoding in stack of stars (SOS) sequences allows for 3D imaging with these advantages. The temporal resolution can be further increased by taking advantage of partial Fourier sampling in the slice direction.

While the implementation of non-Cartesian sampling trajectories has historically had some difficulties, these issues have been largely overcome. Off-resonance artifacts produce blurring instead of uni-direcitonal shift, but a more uniform field and increased readout bandwidth can help decrease the blur. Errors in the gradient timing can produce significant artifacts, but several correction methods have been successfully implemented. Finally, efficient algorithms and computer hardware can significantly reduce the computation time required to grid the non-Cartesian measurements onto a Cartesian grid.

Many regions of the body have significant amounts of adipose tissue near where interventional treatments are performed (e.g. breast, uterus), which can affect image quality. The strength of the chemical shift artifact and SNR are both related to the readout bandwidth. As the readout bandwidth is decreased, the SNR and chemical shift artifact will both increase. A simple method to maintain SNR while decreasing the chemical shift artifact is to increase the readout bandwidth and acquire multiple echoes. The individual echoes will have lower SNR; however, data from each echo can be combined to increase the overall SNR of both the magnitude and phase information. Acquiring multiple echoes has the added benefit of allowing calculation of T2* and the initial signal magnitude, M (0), as well as separate water/fat images. T2 has been shown to have a linear relationship with temperature in adipose tissue and has been used as a measure of temperature to monitor near field heating. The signal magnitude also has a temperature dependence through its dependence on temperature-dependent T1.

SUMMARY

Embodiments of the present invention address and overcome one or more of the above shortcomings and drawbacks, by providing methods, systems, and apparatuses related to a 3D multi-echo SOS sequence with pseudo golden angle (PGA) sampling and KWIC temporal weighting. The techniques described herein may be applied to simultaneously provide multiple quantitative measurements such as proton resonance frequency (PRF) shift temperature, M(0), and T2*.

According to some embodiments, a method for producing an image of a subject using a magnetic resonance imaging (MRI) system includes acquiring a series of echo signals by sampling k-space along radial lines that each pass through the center of k-space. Each projection of the radial lines is divided into multiple echoes and successive projections are spaced by a predetermined angular distance. This predetermined angular distance may be, for example, a pseudo golden angle, a factor that depends on the golden angle, or a multiple of a Fibonacci number. The series of echo signals are reconstructed into a plurality of images, wherein each image corresponds to a distinct echo signal.

In one embodiment of the aforementioned method, the series of projections comprises (i) a series of inner projections spaced according to a first angle corresponding to a ratio of a first Fibonacci number to a maximum Fibonacci number and (ii) a series of outer projections spaced according to a second angle corresponding to a ratio of a second Fibonacci number to the maximum Fibonacci number. The acquired echo signals are reconstructed into a plurality of images, wherein each image corresponds to a distinct echo signal. In one embodiment, reconstruction is performed using a KWIC reconstruction process.

In some embodiments of the aforementioned method, respiration phase offsets are measured by linearly fitting the slope of the phase at k-space center from the series of echo signals as a function of TE using linear regression. Then, respiration correction is performed on the series of echo signals using the respiration phase offsets. In one embodiment, the MRI system comprises a plurality of coils that independently measure the slope. Based on this configuration, the slope of the phase may be averaged across all of the coils over multiple respiratory cycles to obtain a baseline slope. Then, the baseline slope may be subtracted from the phase slope measured by each coil.

According to another aspect of the present invention, a method for performing thermometry using an MRI system includes acquiring a series of echo signals by sampling k-space along each projection in a series of projections using a stack of stars sequence. The successive projections are spaced apart by an angular distance equal to a PGA. A PRF temperature change in the subject may then be calculated using phase information from the series of echo signals. In some embodiments, the method further includes calculating an initial signal magnitude and transverse relaxation time values based on the series of echo signals.

In some embodiments, the aforementioned method for performing thermometry further includes reconstructing the echo signals into a plurality of images using a KWIC reconstruction process, with each image corresponding to a distinct echo signal. In one embodiment, the KWIC reconstruction process uses a sliding window that advances over multiple projections for each echo signal and the sliding window is asymmetric in time and k-space center is reconstructed at the end of the sliding window.

Various techniques may be used for calculating the PRF temperature change in the methods discussed above. For example, in some embodiments, the PRF temperature change is calculated independently for each echo signal using phase information from a first echo signal acquired in the series of echo signals as a reference phase. In other embodiments, the PRF temperature change is calculated independently for each echo signal using phase information corresponding to a reference signal acquired at the same rotation from k-space center as the echo signal as a reference phase. In other embodiments, the PRF temperature change is calculated across the series of echo signals using phase information from a first echo signal acquired in the series of echo signals. In other embodiments, the PRF temperature change is calculated across the series of echo signals and the PRF temperature change for each individual echo signal is calculated using a reference signal acquired at the same rotation from k-space center as the individual echo signal as a reference phase.

According to another aspect of the present invention, a system for reconstructing magnetic resonance imaging data includes an imaging device and a central computer. The imaging device comprises coils configured to acquire a series of echo signals by sampling k-space along each projection in a series of projections using a stack of stars sequence. As with the methods described above, successive projections in the series of projections are spaced apart by an angular distance equal to a PGA. The central computer is configured to reconstruct the echo signals into a plurality of images using a reconstruction process (e.g., KWIC), with each image corresponding to a distinct echo signal.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to performing Magnetic Resonance Imaging (MRI) temperature measurements using 3D multi-echo stack-of-stars radial acquisitions. More specifically, 3D magnetic resonance temperature imaging (MRTI) is accomplished with 2D radial acquisition in-plane and Cartesian acquisition through-plane, allowing an arbitrary number of slices. To reduce sensitivity to off resonance effects due to magnetic field inhomogeneity and the frequency shift between adipose and aqueous tissue, the readout is segmented into multiple short readouts each covering the same line of k-space. Each line measurement would be identical except for signal decay and off-resonance effects. The image reconstruction takes all of these factors into account and creates images of fat/water (normal tissue) as well as the map of the main magnetic field (B0). The method then uses the proton resonance frequency to measure change in temperature of the aqueous tissue, and other factors such as T1, T2 or signal magnitude to measure the change in temperature of fat. The techniques described herein may be applied to measure temperature during thermal therapy in various parts of the body. For example, techniques may be used for temperature imaging in the breast where there is a lot of fat mixed with glandular tissue. As another example, the techniques are also useful for transcranial applications where temperature needs to be measured over a large volume.

Figure 1:
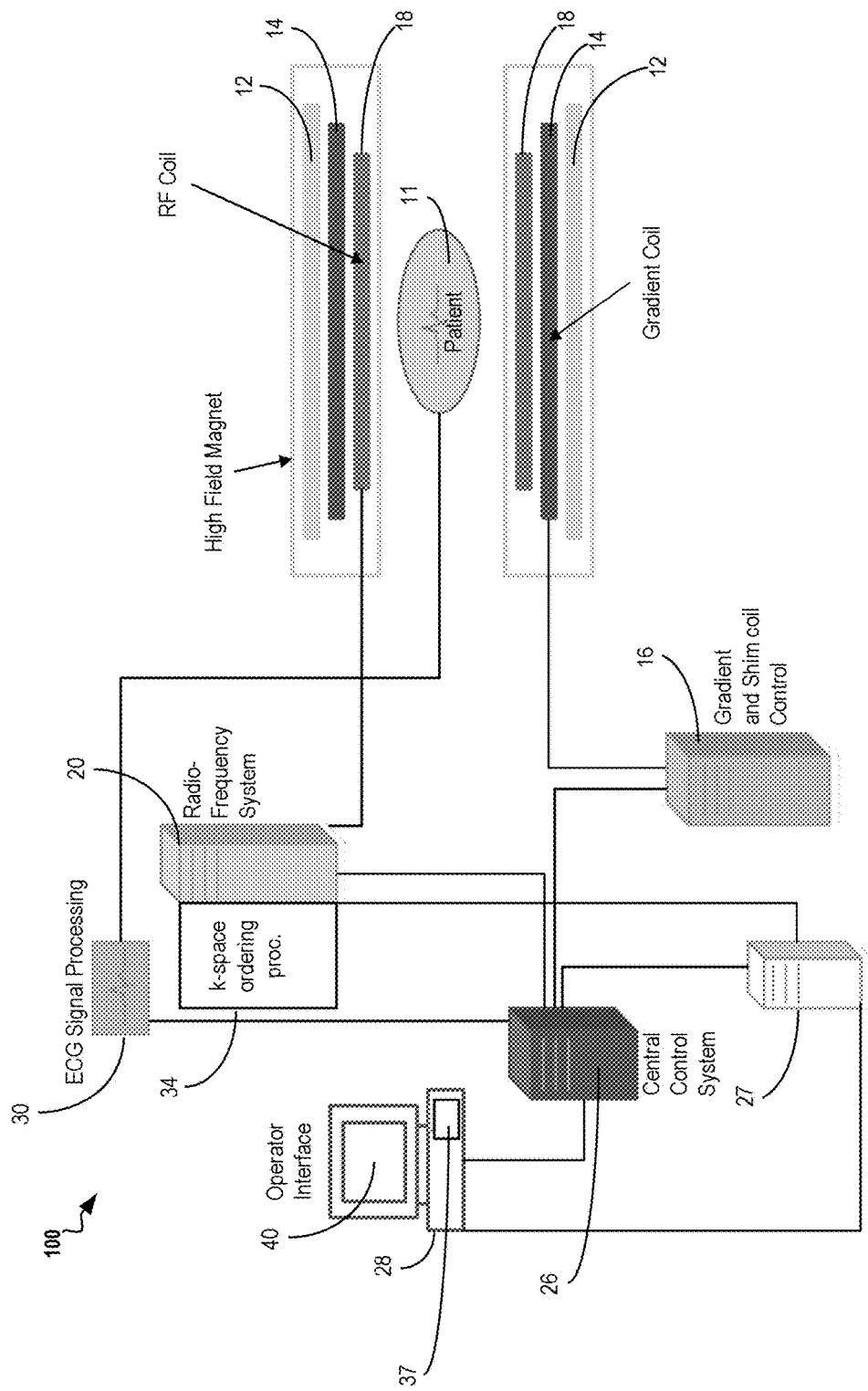
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field gradient pulses for magnetic resonance imaging pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space ordering processor unit 34 to provide a magnetic resonance dataset to an image data processor for processing into an image. In some embodiments, the image data processor is located in central control system 26. However, in other embodiments such as the one depicted in FIG. 1, the image data processor is located in a separate unit 27. Electrocardiogram (ECG) signal processing 30 provides ECG signals used for pulse sequence and imaging synchronization. A two or three dimensional k-space storage array of individual data elements in k-space ordering processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field and a sequence of gradient (coils 14) and RF (coil 18) pulses for use in acquiring multiple individual frequency components corresponding to individual data elements in the storage array. The individual frequency components are successively acquired, for example, using an imaging trajectory with a radial path as described in further detail below. A storage processor in the k-space ordering processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which is substantially minimized.

Central control system 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control system 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction including, without limitation, KWIC-based reconstruction techniques as described in greater detail below.

According to various embodiments described herein, the system 100 illustrated in FIG. 1 may be configured to apply a 3D multi-echo SOS sequence with pseudo golden angle (PGA) sampling and KWIC temporal weighting to simultaneously provide multiple quantitative measurements such as proton resonance frequency (PRF) shift temperature, M(0), and T2*. 3D multi-echo SOS simultaneously provides high spatial and temporal resolution measurements, measures and corrects respiration artifacts through self-navigation, and provides water/fat separation. The KWIC reconstruction algorithm and quantitative measurements are described below in detail. Four methods of calculating PRF temperature change from multi-echo PGA SOS are also presented below.

Figure 2:
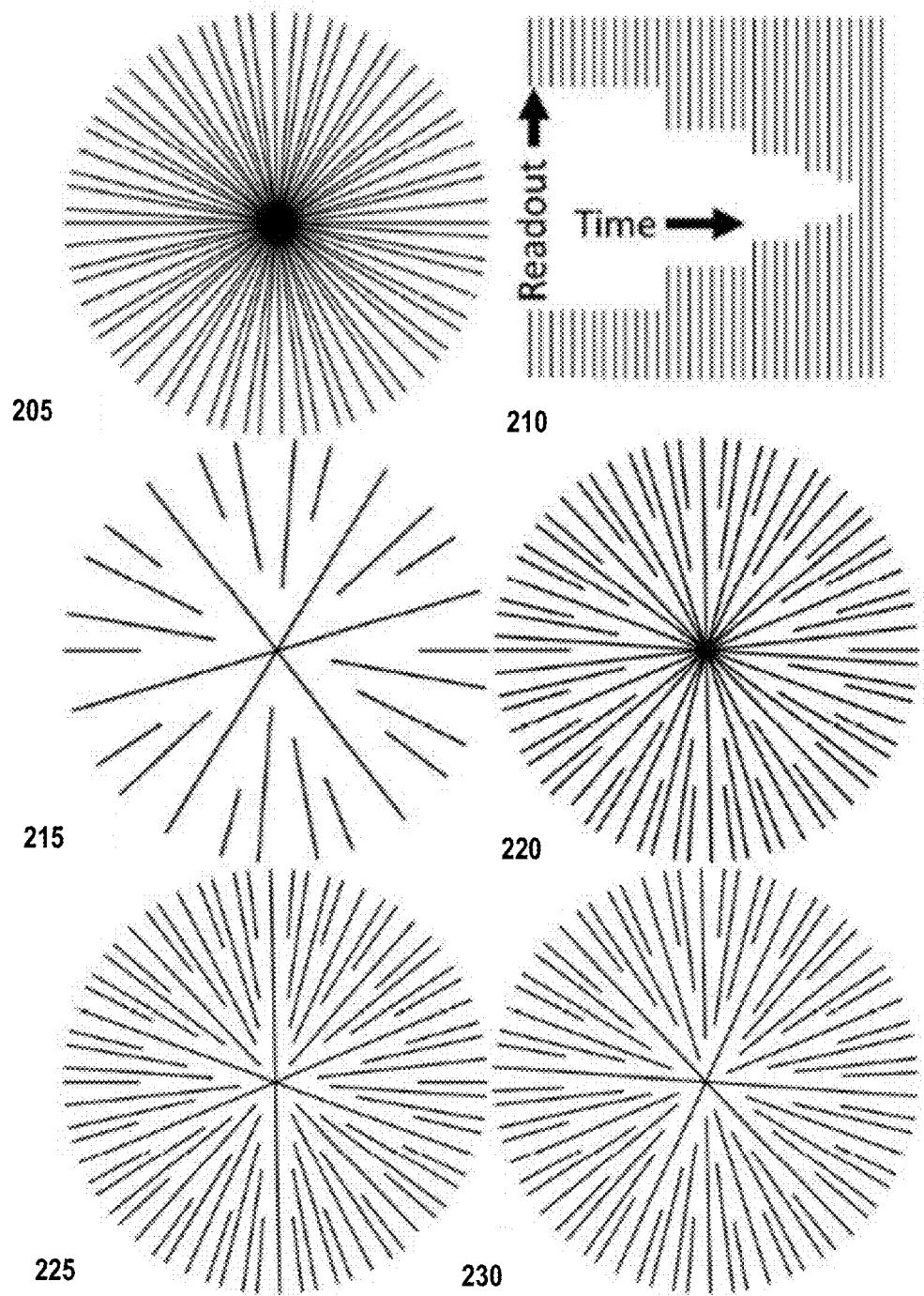
FIG. 2 provides an example of fully sampled PGA k-space, along with a corresponding KWIC window and additional k-space samplings, as may be used in some embodiments.

FIG. 2 illustrates example sampling patterns used in implementing a 3D multi-echo stack of stars spoiled gradient echo sequence, according to some embodiment. In these examples, the sequence is modified such that the angle increment between projections was the PGA, $\theta=(1-233/377)*360° \approx 137.56°$. The PGA is based on the ratio of two Fibonacci numbers and will cause the k-space trajectory to repeat exactly after 377 projections. Increased temporal resolution may be achieved by making use of KWIC with the PGA sampling pattern. GA projection increments guarantee an optimal projection distribution for any arbitrary number of projections, and by using a sliding window an arbitrary number of time points with arbitrary temporal resolution can be reconstructed. Optionally, a KWIC reconstruction window may be used with GA, where the SNR difference between uniformly distributed radial projections and GA sampling is minimized when the number of acquired projections is equal to a Fibonacci number. KWIC results in images with the effective temporal resolution of the time required to readout the center of k-space while maintaining the high resolution data from the outer portions of k-space. The overall signal contrast and relatively low resolution of the FUS heating is contained in the central region of k-space and updated much more frequently than the high frequency region which changes more slowly.

Sampling pattern 205 shows an example of a fully sampled PGA k-space with 34 projections. The properties of the sampling pattern and the KWIC reconstruction window used in the techniques described herein depend on the number of projections included through the center and outermost rings. For example, in one embodiment, KWIC window used in the reconstruction has 13 projections in the center and each successive ring uses the next higher Fibonacci number of projections up to 377 in the outermost ring. The window is asymmetric in time, placing the center of k-space at the end of the temporal window, as shown in window 210 shown in FIG. 2.

Placing the center of k-space at the end of the window ensures that the majority of the image information comes from the most recently acquired data. The outer radii of each ring (as a percent of the total radius) were determined by the ratio of the number of projections in the ring and the number in the outermost ring: (13, 21, 34, 55, 89, 144, 233, 377)/377=(0.035, 0.056, 0.09, 0.146, 0.236, 0.382, 0.618, 1). Including fewer total projections while keeping the same number in the center (as shown in sampling patter 215) will increase the overall temporal resolution, but it will also increase the angular spacing between lines in the center. Thus, there is a tradeoff between the temporal resolution and undersampling artifacts. Keeping the same number of outer lines while increasing the number through the center simply increases the radius of the innermost ring, as shown in sampling pattern 220 in FIG. 2.

Between each reconstructed time point, the sliding window may be advanced by multiple projections. For example, in FIG. 2, the window was advanced by 13 multiple projections. After the k-space filter and density compensation are applied, the data can be regridded using a non-uniform fast fourier transformation (NUFFT). When using a GA or PGA projection increment with KWIC, the distribution of k-space points in relation to each other remains unchanged in subsequent time frames, but the entire distribution rotates about the center. This is demonstrated in FIG. 2, where the distribution of points in sampling pattern 225 are the sampling pattern 230 except rotated about the center. This causes any remaining artifacts from re-gridding to change spatially between reconstructed time points. By incrementing with a PGA that repeats every 377 projections, and advancing the sliding window by 13 projections, the k-space distribution rotation will repeat after 29 reconstructed time frames. This allows a multi-baseline library, based on the 29 rotations of the k-space distribution, to be used in temperature difference calculations. Images may then be reconstructed online or offline using techniques generally known in the art.

In some embodiments, the KWIC window may be applied after respiration correction. Respiration correction techniques generally known in the art may be adapted by measuring phase variation using self-navigation from the center of k-space instead of separate navigator readouts. The slice Fourier transform was applied before respiration correction was performed, thus correcting each slice separately. The phase of the center of k-space as a function of echo time (TE) was unwrapped using Equation 1:

$$\varphi_1 = \angle p_1$$

$$\varphi_n = \angle (p_n p^*_{n-1}) + \varphi_{n-1} \qquad 1$$

where $p_n$ is the complex value at the center of k-space, $\varphi_n$ is the phase of the nth echo and $\angle$ is the angle operator. This unwrapping method works as long as the phase increment between echoes is less than $2\pi$. Respiration phase offsets may be measured by linearly fitting the slope of the phase at the center of k-space from the multiple echoes as a function of TE using linear regression.

Each measurement coil will measure a different inherent non-zero phase slope due to spatial variation in B0 between sensitive volumes. This inherent phase slope can be removed by averaging the measured slope over multiple respiratory cycles to obtain a baseline (non-varying) slope and subtracting the baseline from each measurement for each coil independently. For example, in one embodiment, the first 377 projections are arbitrarily chosen for the baseline as it would cover multiple respiratory cycles. This method also measures and corrects for weighted average B0 field drift for each coil (weighted by the coil sensitivities). After removing the baseline phase, the remaining measured phase slope variation is primarily due to respiration motion. This measurement through the center of k-space assumes a spatially uniform off resonance from respiration. While this is not entirely true, as it has been shown that the B0 offset varies spatially, using an array of coils does provide some spatial sensitivity to the off-resonance measurement. The phase of each echo may then be adjusted to remove the variation in phase due to respiration at their individual read time in the echo train, using techniques generally known in the art.

Multi-coil data may be combined using a slightly modified version of Roemer's equation as described in Roemer P B, Edelstein W A, Hayes C E, Souza S P, Mueller O M. The NMR phased array. Magn Reson Med 1990; 16(2):192-225. The magnitude information may be combined using the standard Roemer's equation, which is reproduced here in slightly different notation as Equation 2, where the complex image value is used instead of the complex sensitivity for each coil:

$$M = \left( \sum_{j,k=1}^{Nc} p_j R_{j,k}^{-1} p_k^* \right)^{\frac{1}{2}} \qquad 2$$

In Equation 2, M is the combined magnitude image data, $p_j$ and $p_k$ are the complex image data using KWIC from coils j and k, and $R_{j,k}^{-1}$ is the inverse noise covariance. This coil combination results in an optimal combination of magnitude information, though it contains no phase information. The phase information can also be optimally combined using a slightly modified version of Equation 2 by replacing the complex image value, $p_k$, with a complex phase reference. For example, in one embodiment, a fully sampled set of images, $^f p$, may be reconstructed without a KWIC window using the first 377 projections, to minimize undersampling artifacts. These images may then be used as a reference phase for the phase information coil combination.

The complex data from the first echo for each coil may be used as the reference phase for each echo and for each reconstructed time point, as this will preserve the phase evolution with TE. The phase information may then be combined using the modified Roemer's equation shown in Equation 3, $$\psi = \angle \left( \sum_{j,f=1}^{Nc} p_j R_{j,k}^{-1f} p_{k,ref}^* \right) \qquad 3$$

where $^f p_{k,ref}$ is the fully sampled complex reference data from coil k. By combining the phase information from each coil using a reference phase, the resulting data is a phase difference from the reference phase. The magnitude and phase information were recombined through Equation 4

$$P = Me^{i\psi} \qquad 4$$

The fully sampled multiple coil images may also be combined to be used later for water/fat separation.

As is generally understood in the art, proton resonance frequency (referred to herein as PRF), is sensitive to temperature. Thus, PRF can be used to measure small temperature changes in a tissue, with high accuracy, using MRI. Various techniques may be used in performing PRF measurements in accordance with different embodiments of the present invention. Four example calculation methods are discussed herein. First, in one embodiment, the PRF temperature difference is calculated using each echo's phase independently and the first KWIC reconstructed time image as the reference phase for subtraction. According to the second calculation method, the difference for each echo is calculated independently, except a multi-baseline library is used, where the reference phase is from the image where the k-space distribution was in the same rotation as the current image. With the third calculation method, the temperature change is calculated using the combined echo phase, described below, using the first reconstructed time image as the reference phase. Finally, the fourth calculation method determines the combined echo phase and a multi-baseline library by the rotation of the k-space distribution may be used for temperature calculation.

The phase data from each echo may be combined to improve temperature precision using a weighted linear least squares fit of the phase as a function of echo time as shown in Equation 5, $$X^2 = \sum_j \frac{(\psi(x, TE_j) - (a + bTE_j))^2}{\sigma^2(\psi(X, TE_j))} \qquad 5$$

$$a = \psi_0(x) \quad b = \beta(x)$$

where $\psi_0(x)$ is the initial phase of pixel x at TE=0 ms, $\beta(x)$ is the slope of the phase change, $\psi(x,TE_j)$ is the measured phase of the xth pixel at the jth TE, and $\sigma^2(\psi(x,TE_j))$ is the variance of the phase at each pixel x for the jth TE. The variance of the phase is proportional to one over the magnitude squared, $$\sigma^2(\psi(x, TE_j)) \propto \frac{1}{M(x, TE_j)^2} \qquad 6$$

making the combined phase simply weighted by the magnitude squared.

$$X^2 = \sum_j M(x, TE_j)^2 (\psi(x, TE_j) - (a + bTE_j))^2 \qquad 7$$

The solutions for a and b in Equation 7 may be derived as follows. To simplify the readability of the solution, we will express the magnitude of a single pixel x at the jth echo as $y_j$ and the phase of pixel x at the jth echo as $\psi_j$. The weighted linear least squares function in Equation 6 is minimized by taking the derivate of $X^2$ with respect to a and b and setting both equations equal to zero.

$$\frac{dX^2}{da} = -2\sum_{j=1}^{n} y_j^2(\psi_j - a - bTE_j) = 0 \qquad 8$$

$$\frac{dX^2}{db} = -2\sum_{j=1}^{n} y_j^2 TE_j(\psi_j - a - bTE_j) = 0$$

When put into matrix form, this becomes $$\begin{bmatrix} \sum y_j^2 & \sum TE_j y_j^2 \\ \sum TE_j y_j^2 & \sum TE_j^2 y_j^2 \end{bmatrix} \begin{bmatrix} a \\ b \end{bmatrix} = \begin{bmatrix} \sum y_j^2 \psi_j \\ \sum TE_j y_j^2 \psi_j \end{bmatrix} \qquad 9$$

To slightly simplify these equations, the following variables may be defined:

$$r = \Sigma(TE_j^2 y_j^2) \; s = \Sigma(y_j^2 \psi_j) \; t = \Sigma(TE_j y_j^2)$$

$$u = \Sigma(TE_j y_j^2 \psi_j) \; v = \Sigma y_j^2 \qquad 10$$

The first matrix is inverted and multiplied to both sides to obtain the following solutions to a and b $$a = \frac{r*s - t*u}{v*r - t^2} \qquad 11$$

$$b = \frac{v*u - t*s}{v*r - t^2}$$

The combined phase at any TE is then simply given by $$\hat{\psi}(x, TE) = a + bTE \qquad 12$$

The phase information may be unwrapped along the echo dimension using Equation 1 before calculating the fit. Once a and b were obtained, the optimal phase combination may be calculated for the same TE as the last acquired echo using Equation 12.

M(0) and T2* may also be calculated from the multiple echoes. Assuming mono-exponential decay, the signal magnitude in the presence of noise has the form $$M(x, TE_j) = \left( M(x, 0)^2 e^{-2\frac{TE_j}{T_2^*}} + C(x) \right)^{\frac{1}{2}} \qquad 13$$

where $M(x,TE_j)$ is the signal magnitude from the xth pixel at the jth TE and $C(x)$ represents the effective noise variance at the xth pixel.

The offset value of $C(x)$ can be estimated using the magnitude values and is derived as follows. The magnitude of the measured MRI signal in the presence of noise has the form:

$$m(t) = (M(0)^2 e^{-2t/T2^*} + C)_{1/2} = (Ae^{-Bt} + C)^{1/2} \qquad 14$$

where C represents the effective noise variance, which may be spatially variant in radial sequences, $A = M(0)^2$ and $B = 2/T2^*$. This can be expressed with the following form, $$m^2 = y = Ae^{-Bt} + C \qquad 15$$

The offset C can be estimated without using an iterative process. Start by subtracting C from both sides and taking the derivative with respect to t:

$$y - C = Ae^{-Bt} \qquad 16$$

$$y' = -BAe^{-Bt} \qquad 17$$

$$y' = B(C - y) \qquad 18$$

Defining the error function to be $$e = y' - B(C - y) \qquad 19$$

The total squared error to minimize is $$X^2 = \int_{t_0}^{t} (y' - B(C - y))^2 du \qquad 20$$

This error function is optimized further by weighting the squared error by the inverse of y to give more weight to samples closer to the offset C.

$$X^2 = \int_{t_0}^{t} \frac{1}{y}(y' - B(C - y))^2 du \qquad 21$$

The total error function in Equation B8 is minimized to estimate the value of the constant C by taking the derivate of $X^2$ with respect to B and C, setting both equations equal to zero and solving for C, which has the following solution.

$$C = \frac{\ln\frac{y(t)}{y(t_0)} \int_{t_0}^{t} y \, du - (t - t_0)(y(t) - y(t_0))}{\ln\frac{y(t)}{y(t_0)}(t - t_0) - (y(t) - y(t_0)) \int_{t_0}^{t} \frac{1}{y} du} \qquad 22$$

In discreet form with uniform spacing between samples, the solution for C has the following form $$C = \frac{\ln\frac{y_n}{y_1} \sum_{j=1}^{n} y_j - n(y_n - y_1)}{\ln\frac{y_n}{y_1} * n - (y_n - y_1) \sum_{j=1}^{n} \frac{1}{y_j}} \qquad 23$$

where n is the total number of samples.

The value of C(x) estimated from the solution given in Equation 23 may then subtracted from the square of Equation 13, which was then linearized to give $$\ln(M(x, TE_j)^2 - C(x)) = \ln(M(x, 0)^2) - 2\frac{TE_j}{T_2^*} \qquad 24$$

A weighted linear least squares fit of the natural log of the magnitude is shown in Equation 25:

$$X^2 = \sum_j \frac{(\ln(M(x, TE_j)^2 - C(x)) - (a + bTE_j))^2}{\sigma^2(M(x, TE_j))} \qquad 25$$

$$a = \ln(M(x, 0)^2) \; b = \frac{-2}{T_2^*}$$

The variance of the magnitude is also proportional to one over the magnitude squared, $$\sigma^2(M(x, TE_j)) \propto \frac{1}{M(x, TE_j)^2} \qquad 26$$

making Equation 25 also weighted by the magnitude squared.

$$X^2 = \sum_j (M(x, TE_j)^2 - C(x))(\ln(M(x, TE_j)^2 - C(x)) - (a + bTE_j))^2 \qquad 27$$

Figure 9A:
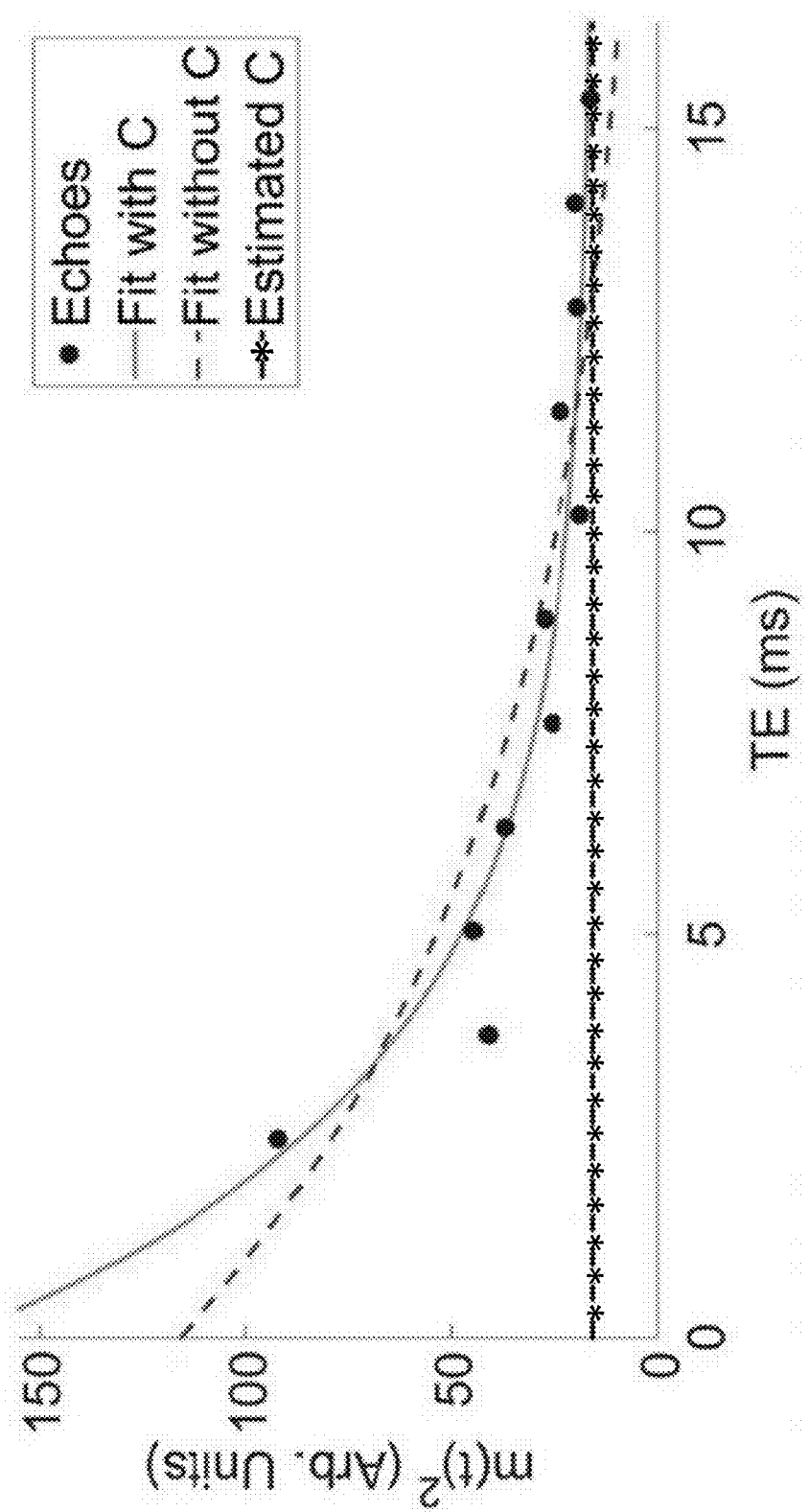
FIG. 9A illustrates an example of SOS multi-echo exponential decay with weighted linear least squares fit to data removing offset C and without removing offset C, according to some embodiments.

Equation 27 has the same form as Equation 7 and has the same solutions for a and b which are derived above by replacing $\psi_j$ with $\ln(M_j^2 - C)$ and $y_j^2$ with $(M(x, TE_j)^2 - C(x))$. An example displaying the fits resulting from whether or not C is accounted for when fitting is shown in FIG. 9A. M(0) and T2* are obtained from a and b by $$\hat{M}(x, 0) = e^{\frac{a}{2}} \quad \hat{T}_2^* = -\frac{2}{b} \qquad 28$$

Variations in M(0) and T2* may also be measured as a percent change using two methods: first, as a difference from the first time frame and secondly, as a difference from the multi-baseline k-space distribution time frames.

To demonstrate the ability of the multi-echo PGA SOS sequence to measure temperature changes, two example experiments and their respective results are described below. The first experiment evaluated the precision of temperature measurements in in vivo breast during non-heating conditions, and the second experiment evaluated the sequence during MRgFUS heating in a pork phantom. All experiments were performed in a Siemens Prisma 3T MRI scanner (Siemens Medical Solutions, Erlangen, Germany) using a breast-specific MRgFUS system with an integrated eight-channel RF coil and an MRI-compatible phase array transducer (256 elements, 1 MHz frequency, 10 cm radius of curvature; Imasonic, Besançon, France and Image Guided Therapy, Pessac, France).

Five healthy female volunteers (Age range: 20-51 years) were recruited for non-heating experiments. Each volunteer was positioned in the breast-specific MRgFUS device. After localization, multi-echo PGA SOS images were acquired in both the coronal and sagittal orientations while the volunteer was free breathing. In each orientation, images were acquired with 3 different sets of imaging parameters (different TR, number of echoes, number of slices) to assess the effectiveness of each. The first image set had the following parameters (voxel size=1.3 mm isotropic; field of view=208×208×20.8 mm; matrix=160×160×16; 1000 radial projections; flip angle=10°; TR=20 ms; TE=2.46+1.29*n, n=0 to 10 ms; readout bandwidth=1080 Hz/pixel; 5/8 partial Fourier in slice direction). The second set of images were acquired using the same imaging parameters except with only the first 6 echoes and TR=11 ms. The third set of images had the same TR/TE as the second set, but acquired twice as many slices with the same isotropic resolution (field of view=208×208×41.6 mm; matrix=160×160×32). The first 20 radial projections from each image set were discarded to ensure the sequence was at steady state before reconstruction. Each image set created 47 reconstructed time points. The effective temporal resolution of each image set was 2.60, 1.43 and 2.86 seconds respectively. A single set of images was reconstructed without a KWIC window using the first 377 projections to minimize undersampling artifacts for use in creating a fat/water mask. Separate water/fat images were generated from the first three echoes of the images reconstructed without the KWIC window using the 3-point Dixon method.

Temperature difference calculations were made using the four thermometry calculation methods as described above. The standard deviation through time of each aqueous tissue voxel was calculated using the separated water/fat images to create a mask. The spatial average of the standard deviation within aqueous tissue voxels over the imaged volume was calculated for each of the four methods described above. The spatial average of the standard deviation from the combined echoes was also calculated as a function of the number of echoes included in the weighted linear least squares fit. M(0) and T2* were calculated using the weighted linear least squares method described above and including only the in phase echoes to minimize errors from signal changes that are not described by the exponential decay model in Equation 13, such as the signal from a mixture of water and fat which would move in and out of phase. The percent change in M(0) and T2* were measured as described above. The standard deviation through time of M(0) and T2* differences were calculated for both of the difference calculations.

For the MRgFUS experiments, the sequence was evaluated during FUS heating conditions using a pork belly sample that contained significant amounts of both fat and aqueous tissues. The phantom was positioned in the same breast-specific MRgFUS system that was used to image the volunteers. The 3D imaging volume was prescribed in a coronal orientation with the same imaging parameters as the second set of in vivo images (TR=11, 6 echoes) and 1905 radial projections (for all sampled kz) were acquired. This resulted in 117 reconstructed time frames. The phantom was sonicated with 25 acoustic W for 40 seconds. The pork phantom was sonicated in two locations, one in aqueous and the other in adipose tissue. PRF temperature measurements were calculated using the four methods and M(0) and T2* differences were also calculated as described above in the section detailing the techniques for thermometry calculations. For comparison, image sets were acquired during identical sonications using a seg-EPI sequence with the following parameters (voxel size=1.3 mm isotropic; field of view=208×145.6×20.8 mm; matrix=160×112×16; flip angle=20°; TR=44 ms; TE=14 ms; EPI Factor=7; readout bandwidth=1020 Hz/pixel; 6/8 partial Fourier in slice direction). PRF temperature measurements for the seg-EPI sequence were calculated using the first time frame as the reference.

Figure 3:
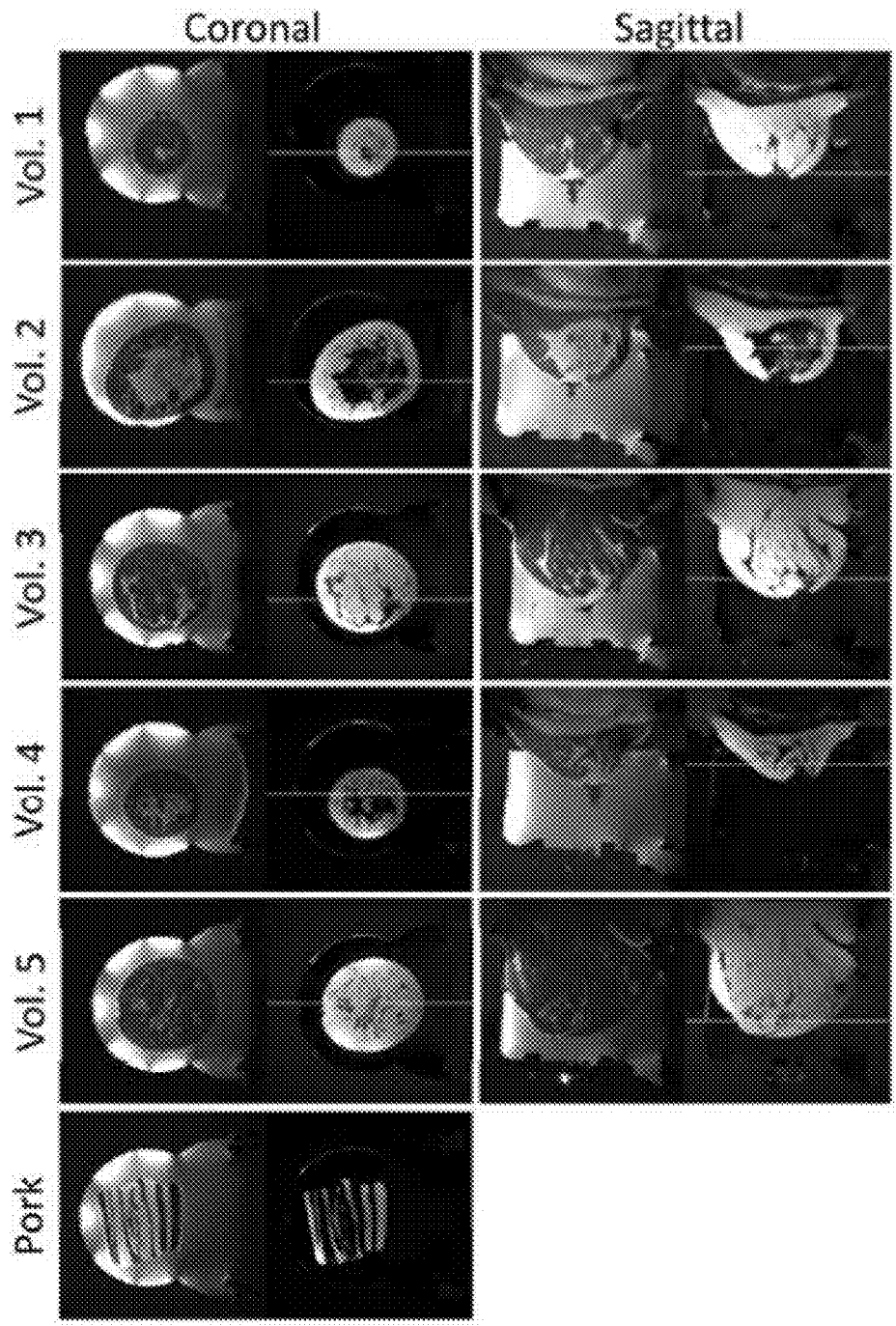
FIG. 3 shows separated water and fat images for in vivo breast coronal and sagittal for five volunteers and a pork phantom.
Figure 4:
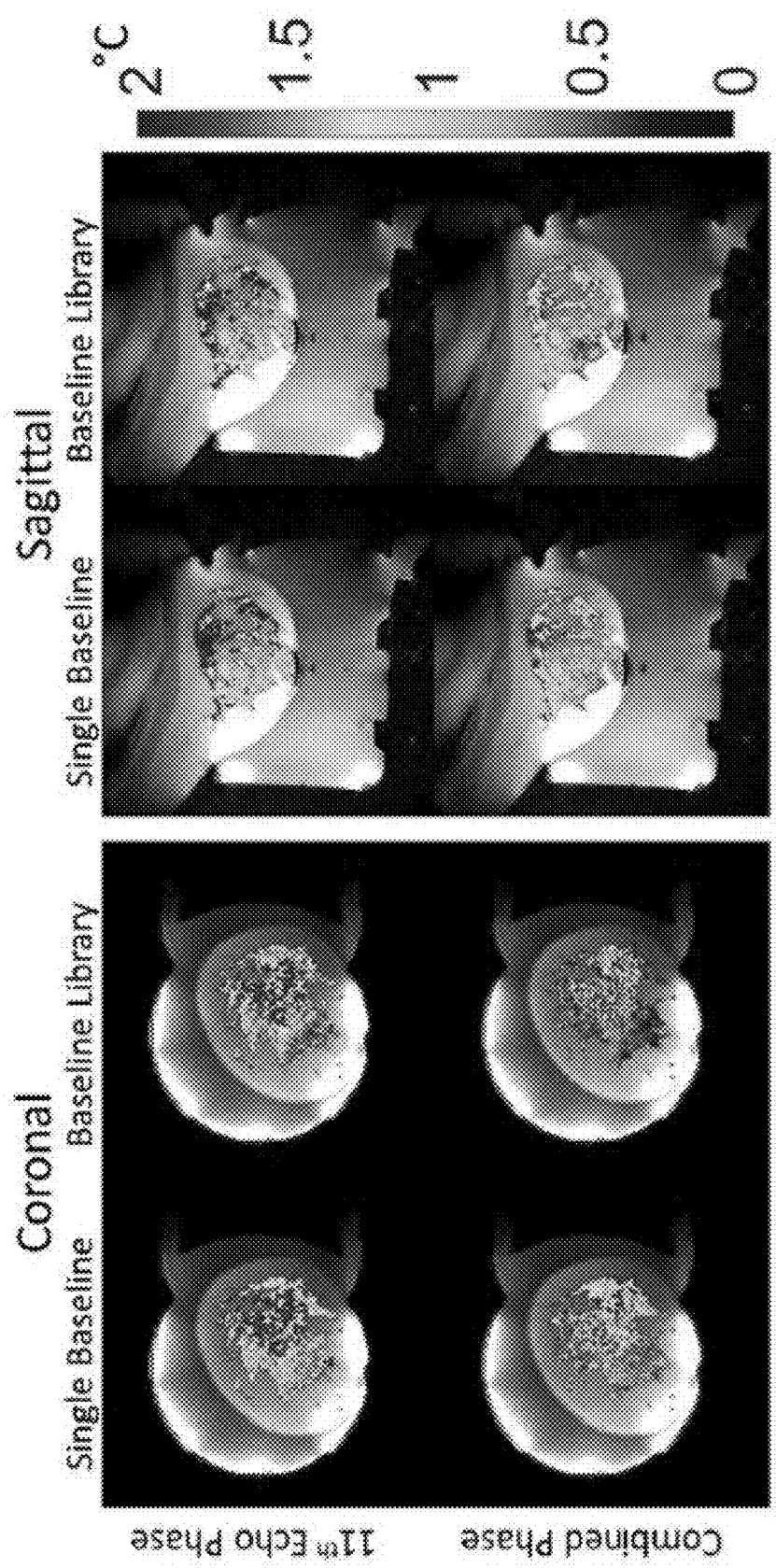
FIG. 4 shows standard deviation through time maps of PRF temperature in aqueous tissue for four calculation methods that may be applied in different embodiments.
Figure 5:
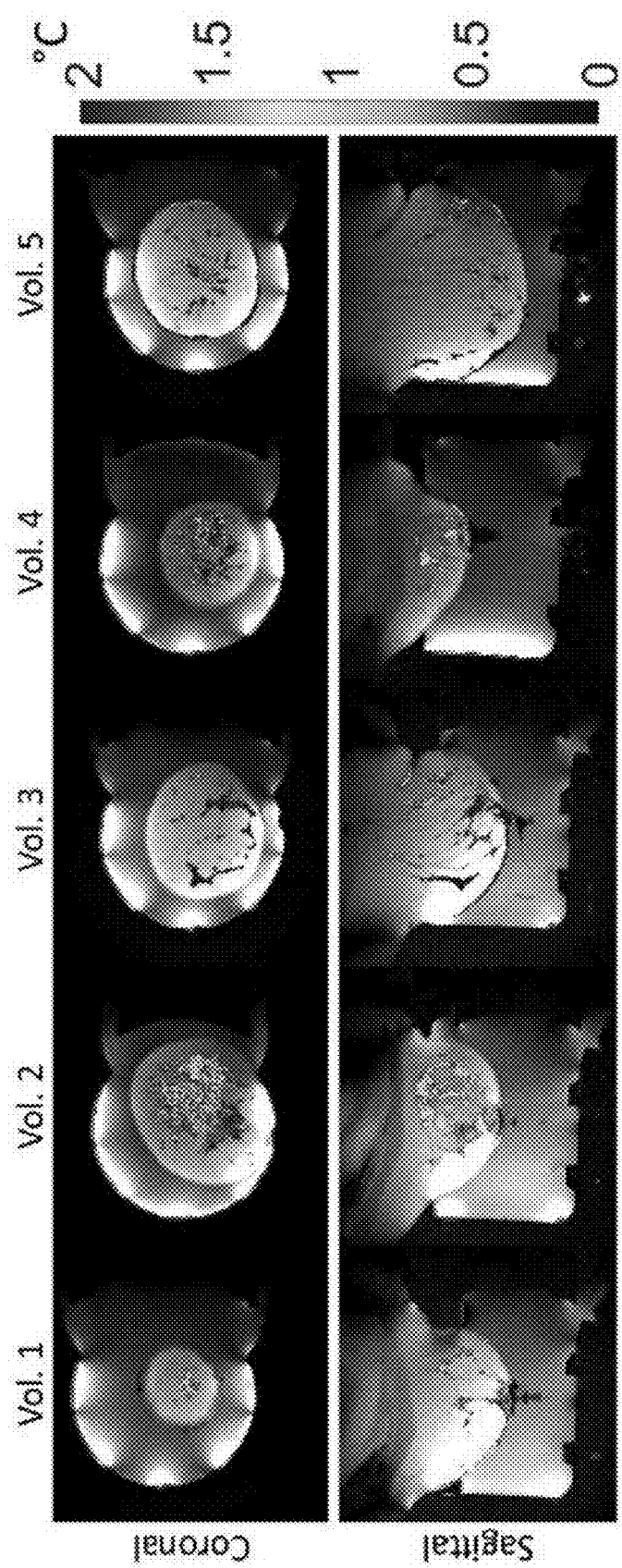
FIG. 5 shows standard deviation through time maps of PRF temperature in aqueous tissue for several volunteers.
Figure 6A:
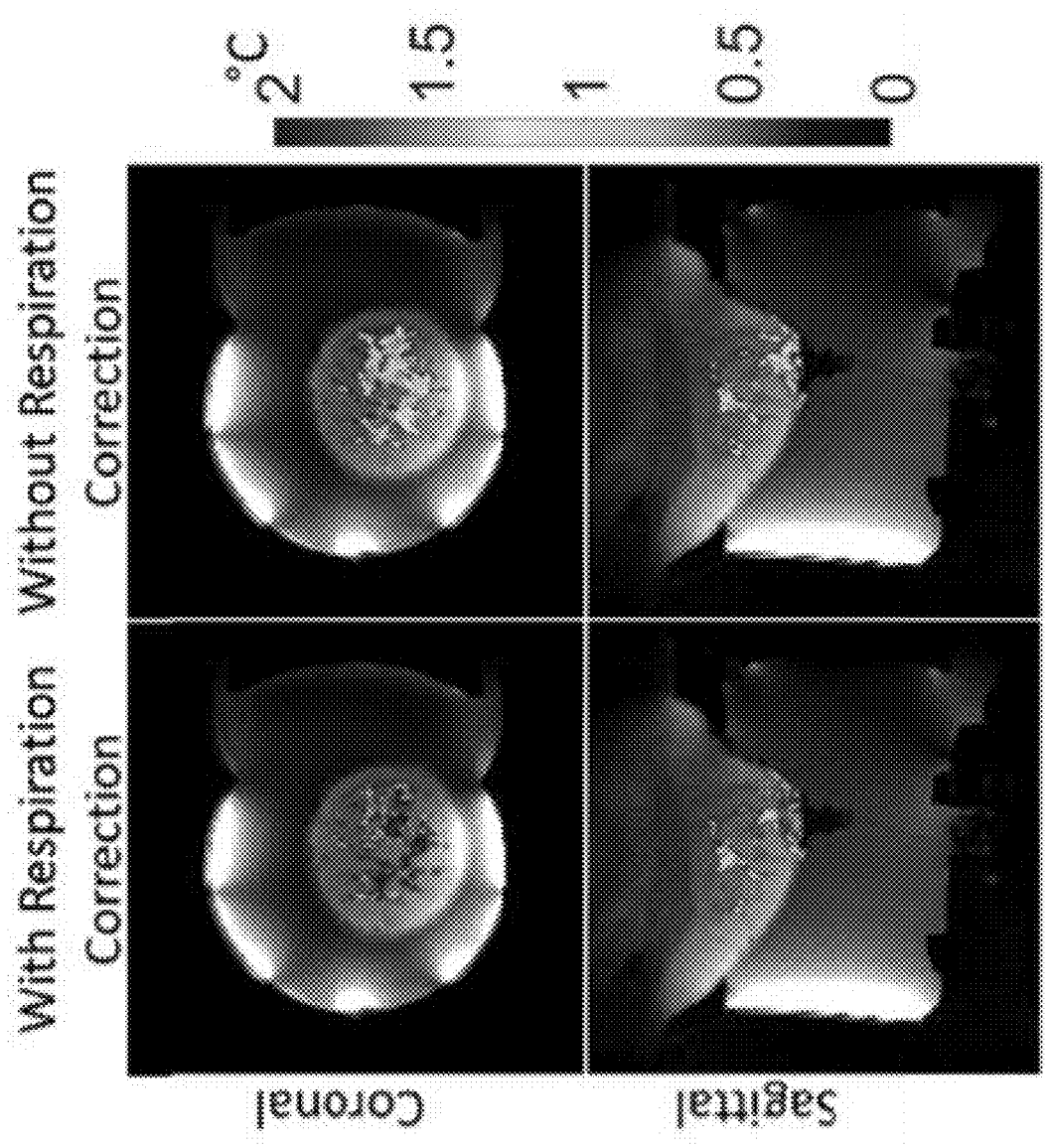
FIG. 6A provides standard deviation through time maps of PRF temperature in aqueous tissue with and without respiration correction for a volunteer.
Figure 6B:
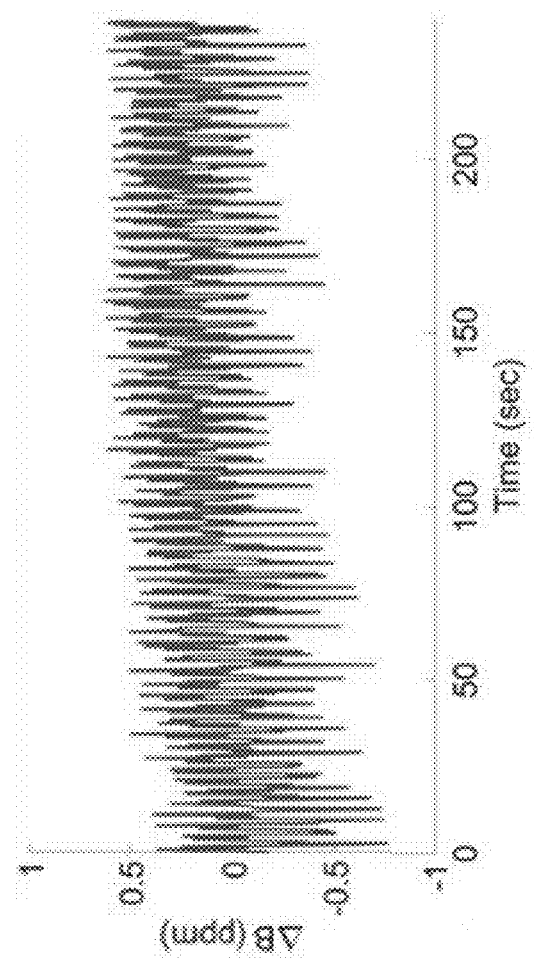
FIG. 6B shows an example of measured field shift in the central slice of the image set shown in FIG. 6A.

The central slice of the separate water/fat images generated from the SOS sequence are shown in FIG. 3 for each of the volunteers in both the coronal and sagittal orientations and for the pork phantom in a coronal orientation. As expected, the amount and distribution of aqueous tissue varied between volunteers. An example of the PRF temperature precision in aqueous tissue for each of the four calculation methods discussed above is shown for volunteer 2 in FIG. 4. FIG. 5 shows the PRF standard deviation maps for each volunteer in both orientations using the fourth method. FIG. 6A shows the PRF standard deviation maps with and without respiration correction for volunteer 4 using the fourth method. For the example, as shown in FIG. 6A, the PRF precision was improved by an average factor of 2.6±1.2 within the aqueous tissue in the breast. FIG. 6B shows an example of measured field shift in the central slice of the image set shown in FIG. 6A.

Figure 7:
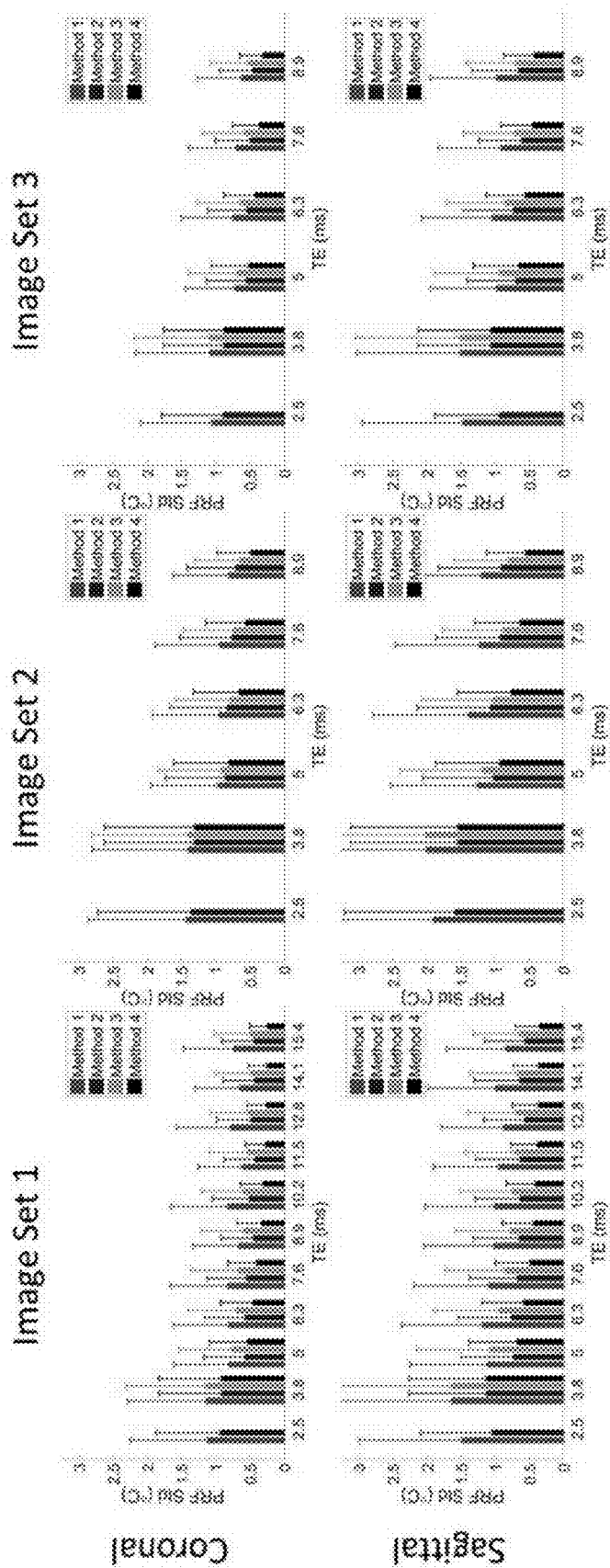
FIG. 7 illustrates spatially averaged PRF standard deviation as a function of echo time (TE) in aqueous tissue in the breast for a volunteer for several calculation methods, as may be acquired in some embodiments.
Figure 8:
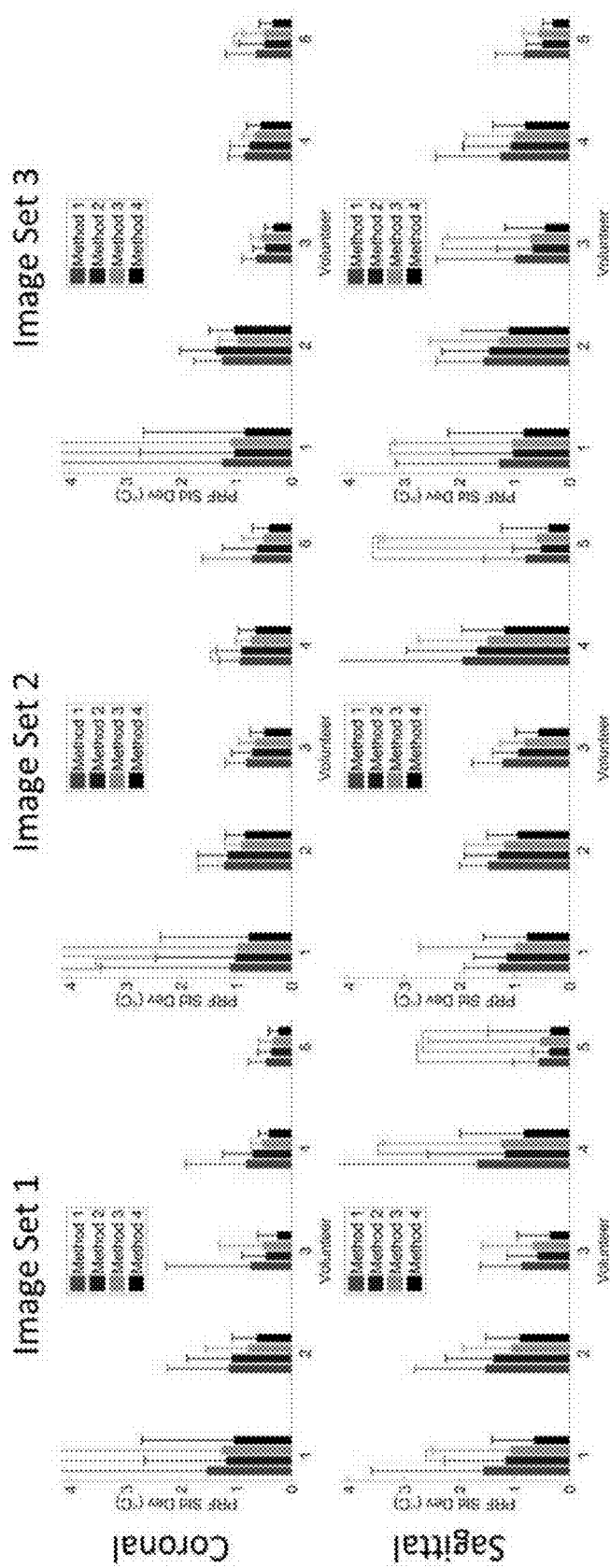
FIG. 8 depicts spatially averaged PRF standard deviation values for the last TE in aqueous tissue in the breast for a volunteer in the coronal and sagittal orientations for four calculation methods that may be implemented in some embodiments.

FIG. 7 displays the spatially averaged PRF standard deviation for volunteer 3 as a function of TE for each of the three image sets in both coronal and sagittal orientation for each of the four calculation methods. The combined echo phase data only include the echoes up to and including the displayed TE. FIG. 8 shows the spatially averaged PRF standard deviation values for each volunteer for each of the four methods at the last TE from the three image sets in both coronal and sagittal orientation. For nearly every case, there was a statistically significant difference between each of the methods. In this example, the fourth calculation method had the highest precision in both coronal and sagittal orientations for all three image sets and volunteers in all but one case (Image Set 3, Coronal, Volunteer 2).

Figure 9B:
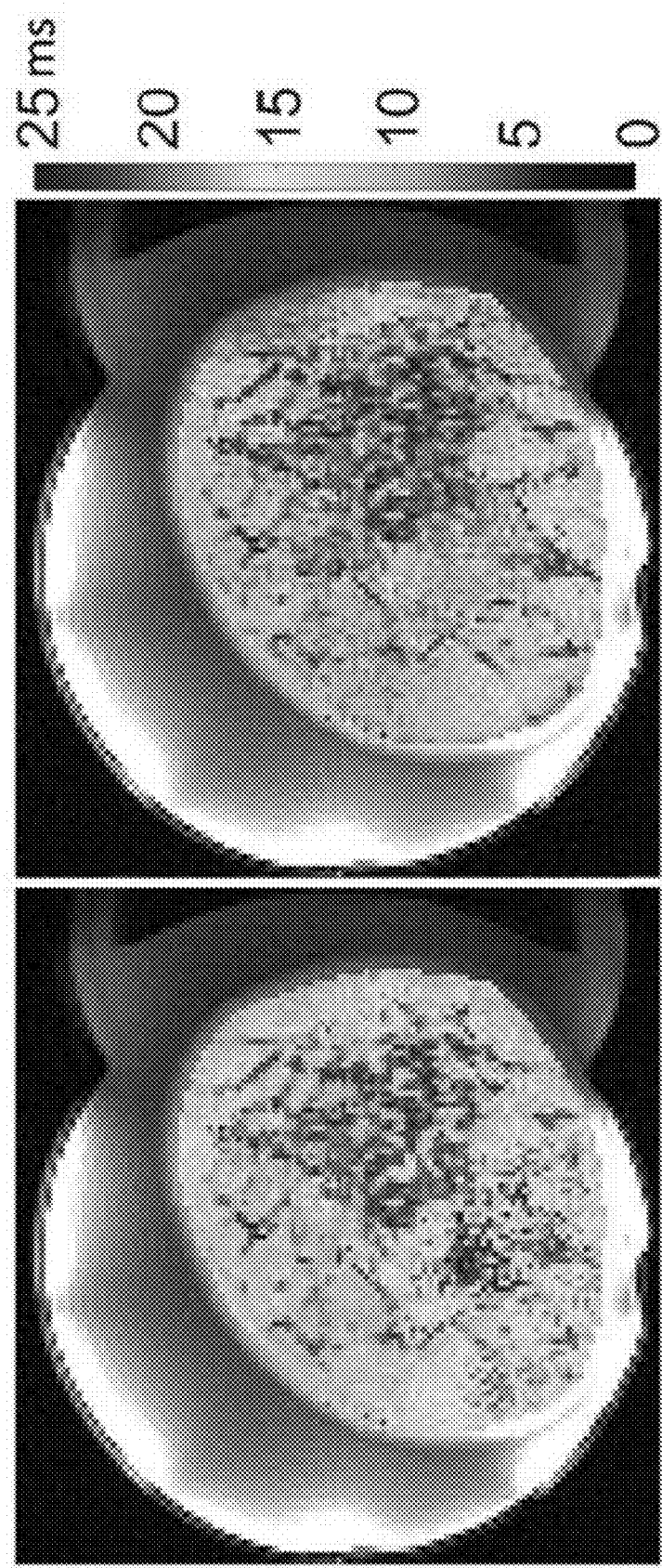
FIG. 9B shows example of T2* measurements within the breast removing offset C and without removing offset C, according to some embodiments.
Figure 9C:
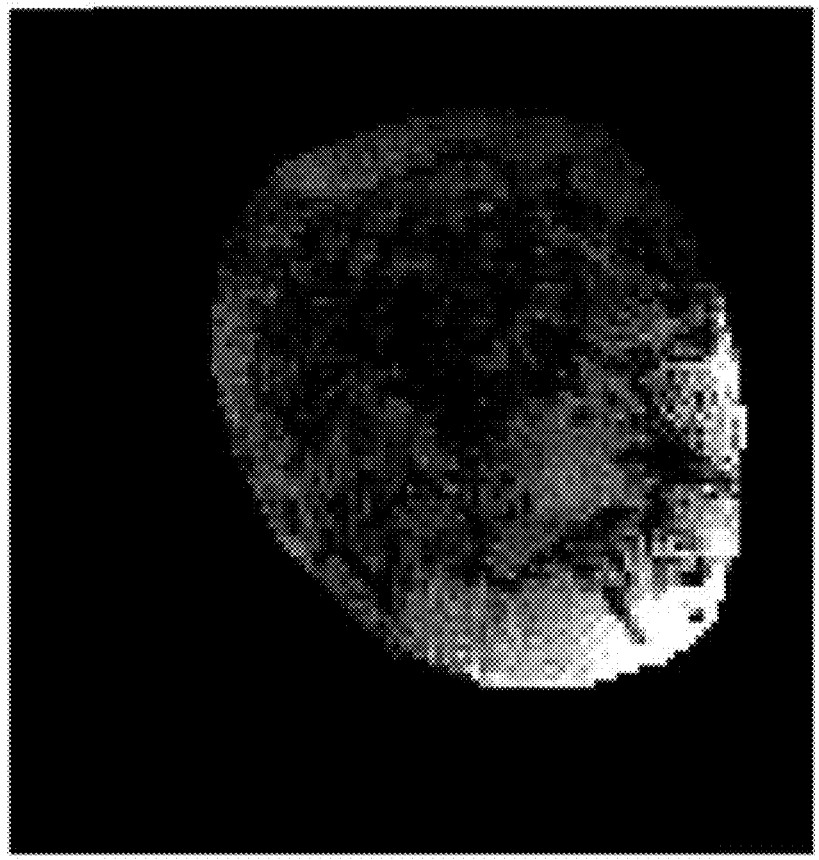
FIG. 9C shows an example of the measured offset value C within the breast, according to some embodiments.
Figure 10A:
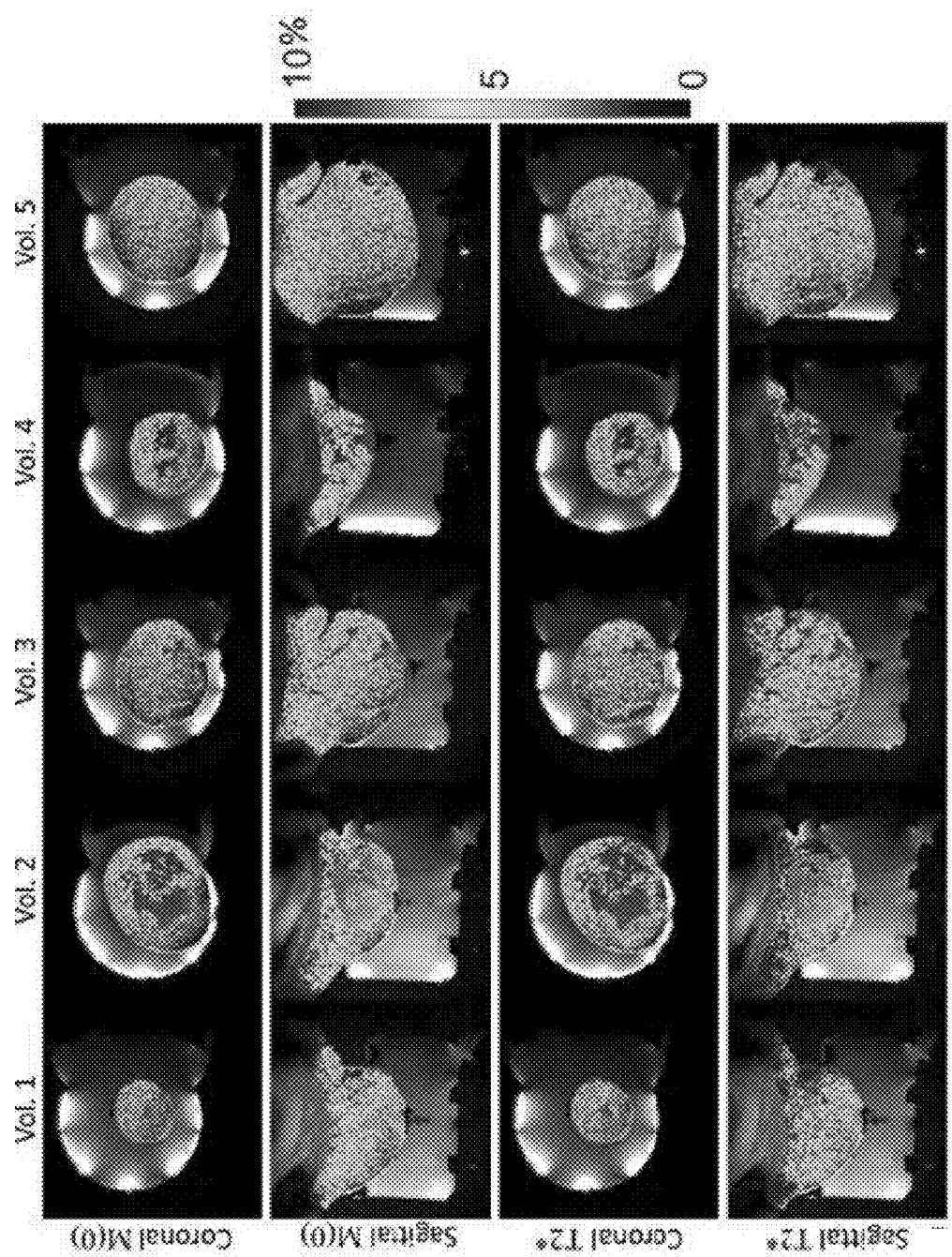
FIG. 10A depicts standard deviation through time maps for volunteers of M(0) and T2* as a percent difference from the baseline value, according to some embodiments.
Figure 10B:
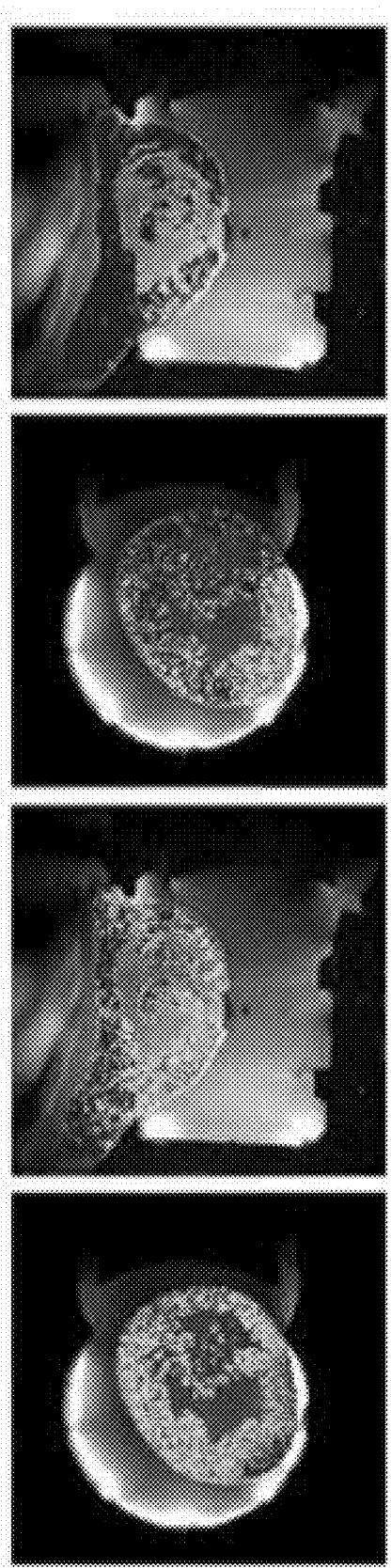
FIG. 10B shows an example standard deviation through time maps when including all echoes in the fit, according to some embodiments.

Examples of the exponential decay fit are shown in FIG. 9A. FIG. 9B shows an example of T2* measurements whether or not the offset C is accounted for, and FIG. 9C gives an example of the offset C within the breast. M(0) and T2* are shown as a percent change from their baselines within adipose tissue in FIG. 10A for each of the volunteers. In all cases the precision of the M(0) and T2* estimates were better when only including the in-phase echoes instead of all echoes as shown in FIG. 10B.

Figure 11:
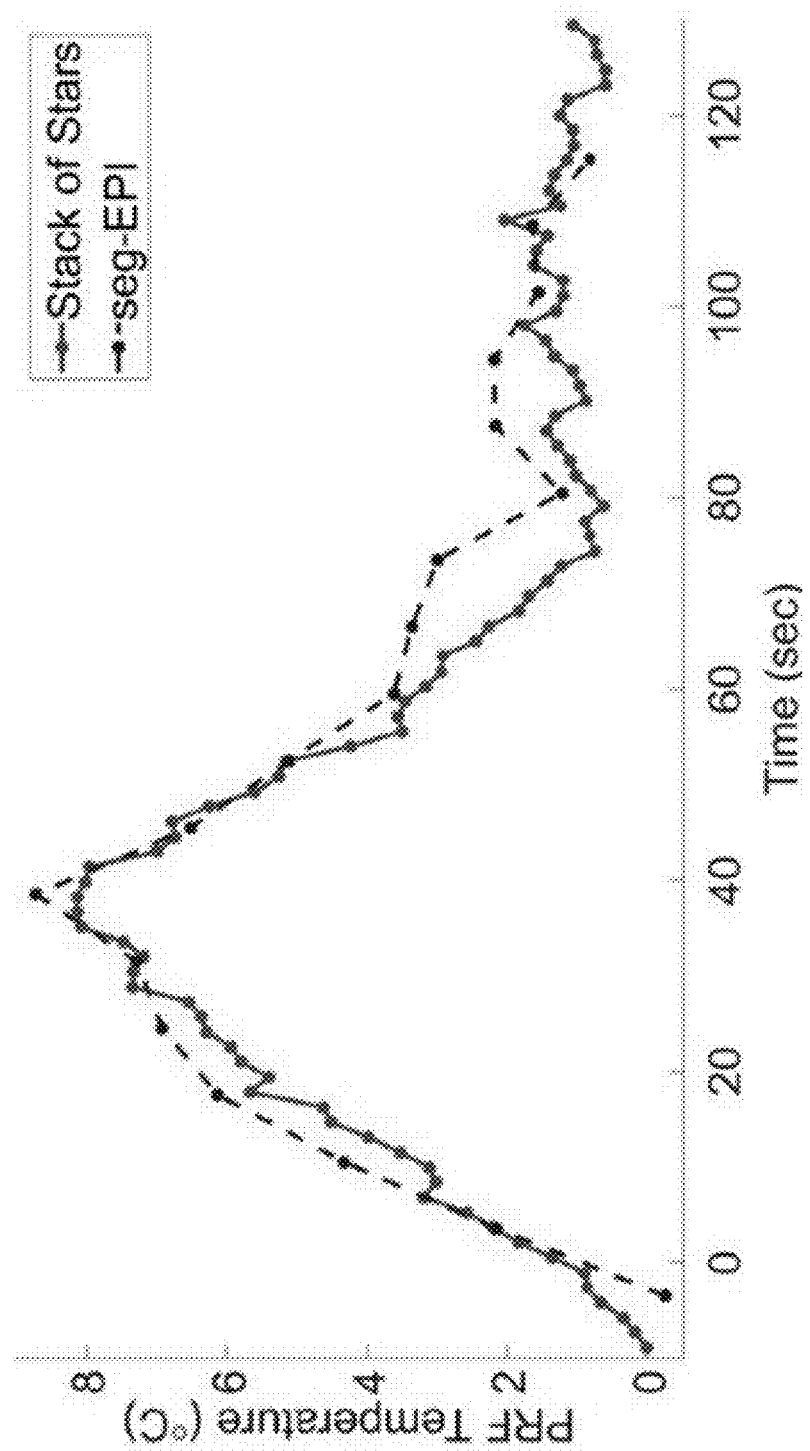
FIG. 11 provides a graph depicting PRF temperature change during FUS heating in aqueous tissue within a pork phantom.

The FUS heating in pork results are shown in FIG. 11. When heating within aqueous tissue, the PRF measurements from the KWIC stack of stars sequence were comparable with those obtained from the seg-EPI sequence. Time lapse videos of the PRF temperature change using the stack of stars and seg-EPI sequences are provided in Supporting Video 51. Both T2* and p showed temperature dependence in pork adipose tissue when heating with FUS.

The multi-echo stack of stars acquisition and reconstruction method described herein provides simultaneous measurements of PRF temperature change, M(0), T2* and water/fat separation with a large field of view (e.g., 208× 208×20.8 mm) with high spatial (e.g., 1.3 mm isotropic) and temporal (e.g., 1.43 s) resolution. In the examples discussed above, PRF precision ranged between ~0.3-1.0° C. between the volunteers and the coronal and sagittal orientations, and the measured PRF temperature change during MRgFUS was comparable to a 3D seg-EPI sequence.

The multiple echo acquisition provides several advantages as demonstrated by the results set out above. Self-navigated respiration correction allowed for free breathing and improved PRF precision as seen in FIG. 7. There was no need for fat saturation because the high readout bandwidth and radial acquisition minimized the chemical shift artifact. The phase information from each echo was combined to significantly improve the precision of PRF temperature measurements as quantified in FIG. 8. For voxels with significant mixing of water and fat, phase combination would likely produce errors due to the frequency difference between water and fat. Combining the phases of only the in-phase echoes would remove the error due to the fat mixture, but would use fewer echoes in the combination. The magnitude information from the in-phase echoes was combined to calculate M(0) and T2* which could potentially be used as a measure of temperature change in adipose tissue as seen in FIG. 11B. The stack of stars sequence provided comparable heating profiles to a 3D seg-EPI sequence as shown in FIG. 11. Another advantage of the stack of stars sequence is that it does not have the same image distortion that is present in a seg-EPI sequence as seen in Supporting Video S1.

The KWIC window improves the temporal resolution while maintaining the high spatial resolution. It also causes the undersampling artifacts to vary between reconstructed time points due to the k-space distribution rotation between reconstructed time points. Using the PGA increment causes the undersampling artifacts to repeat and allows for the use of a baseline library. The PRF temperature measurements calculated from the combined echo phase and using the baseline library had statistically significant improved precision compared to those calculated from a single echo phase with a single baseline. Each k-space disk enclosed by a KWIC ring represents objects or object details within a specific size range. The KWIC algorithm updates central k-space (the central disk), which represents larger objects and detail, with a higher temporal resolution. Fine object details are updated at the same rate with the sliding window, but will have a lower temporal resolution as this information is enclosed by the outer rings of the KWIC window. The temporal resolution of the focus will depend on the KWIC window attributes (number of inner/outer lines, update rate) and the size of the focus. The total number of lines included in the KWIC window can also be adjusted. Lowering the total number of lines will improve the temporal resolution of each ring while sacrificing SNR to increased undersampling artifacts, (as shown in sampling pattern 215 in FIG. 2). These artifacts could possibly be reduced through a compressed sensing or regularization type reconstruction. While all the images in these example experiments were updated at a constant rate of 13 projections, the PGA allows for arbitrary temporal position of the reconstruction. The baseline library can still be used with an arbitrary temporal position, as all that would be required is a baseline image reconstructed with the same k-space distribution rotation.

The precision of the PRF, M(0) and T2* measurements in the example experiments depended on several factors which include location within the breast (distance from chest wall and from imaging coils), the number of lines included in the KWIC window, and the image orientation. Voxels closer to the chest wall experienced greater respiration artifact. The respiration correction assumes a spatially uniform off resonance, which is a more accurate assumption in the coronal orientation, which is likely why the overall precision is greater in the coronal orientation as seen in FIG. 7. M(0) and T2* changes with temperature need calibration and verification before reliable temperature measurements can be made through either parameter. The precisions of M(0) and T2* were higher in adipose tissue compared to aqueous, likely due to the higher signal intensity from the shorter T1 of adipose tissue. It is generally known in the art that T2 in adipose tissue will increase with temperature. T2* is also affected by any intravoxel dephasing. A large temperature gradient across a voxel will decrease T2*, creating an opposite dependence with temperature. Decreasing the voxel size will attenuate this problem but will also lower SNR.

The effective noise variance C was spatially variant, as shown in FIG. 9C, which indicates that the noise is not Gaussian distributed white noise in the SOS sequence. T2* measurements were more uniform within the breast when taking into account C as shown in FIG. 9B. The standard deviation through time of T2* was also improved when accounting for C (not shown). The offset value C used when fitting the exponential decay is only an approximation of the true effects of noise in non-Cartesian magnitude MR images. A more accurate model of the noise may improve the M(0) and T2* precision further.

Figure 12:
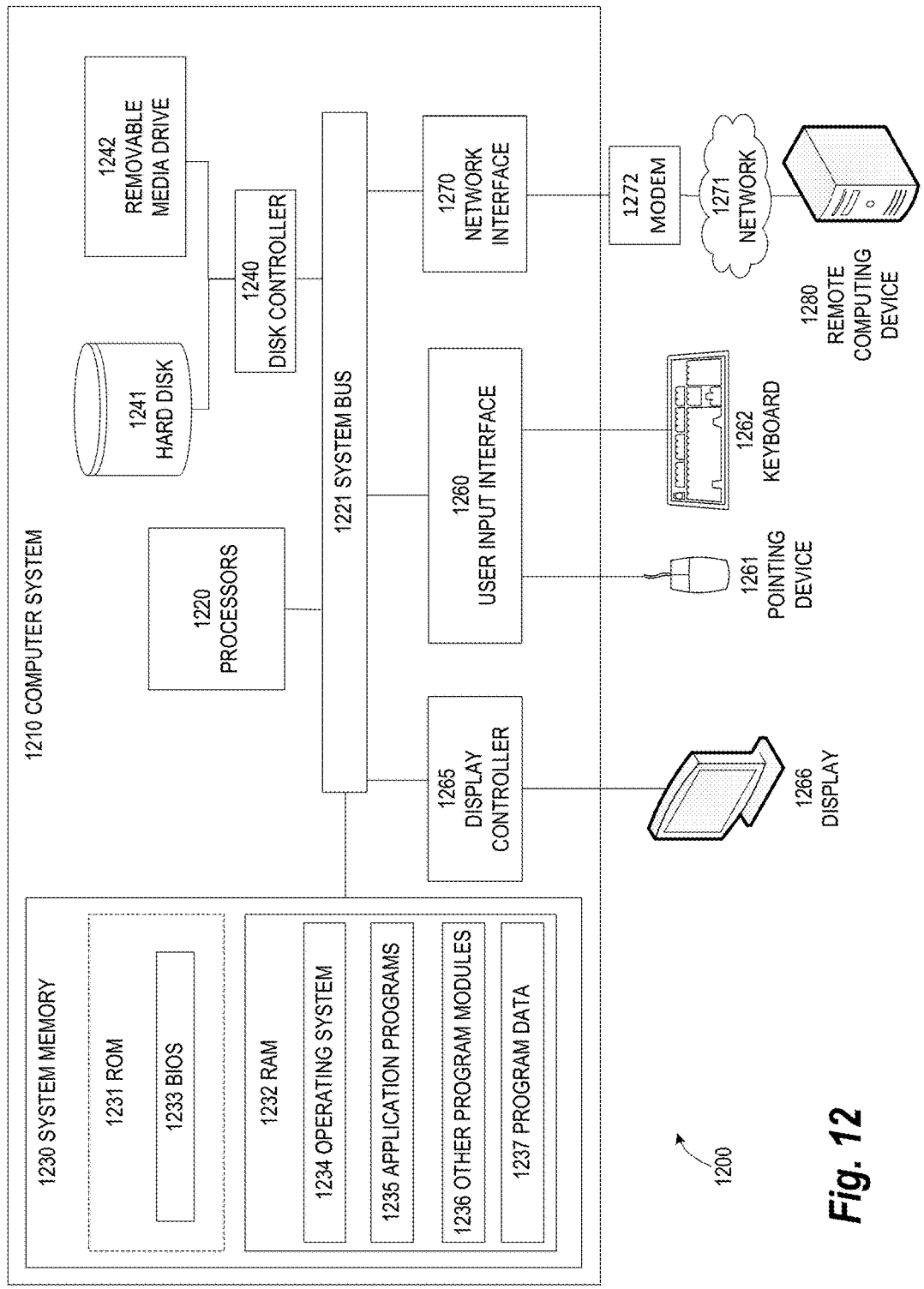
FIG. 12 illustrates an exemplary computing environment within which embodiments of the invention may be implemented.

FIG. 12 illustrates an exemplary computing environment 1200 within which embodiments of the invention may be implemented. For example, the computing environment 1200 may be used to implement one or more of the components illustrated in the system 100 of FIG. 1. The computing environment 1200 may include computer system 1210, which is one example of a computing system upon which embodiments of the invention may be implemented. Computers and computing environments, such as computer system 1210 and computing environment 1200, are known to those of skill in the art and thus are described briefly here.

As shown in FIG. 12, the computer system 1210 may include a communication mechanism such as a system bus 1221 or other communication mechanism for communicating information within the computer system 1210. The computer system 1210 further includes one or more processors 1220 coupled with the system bus 1221 for processing the information. The processors 1220 may include one or more central processing units (CPUs), graphical processing units (GPUs), or any other processor known in the art.

The computer system 1210 also includes a system memory 1230 coupled to the system bus 1221 for storing information and instructions to be executed by processors 1220. The system memory 1230 may include computer readable storage media in the form of volatile and/or non-volatile memory, such as read only memory (ROM) 1231 and/or random access memory (RAM) 1232. The system memory RAM 1232 may include other dynamic storage device(s) (e.g., dynamic RAM, static RAM, and synchronous DRAM). The system memory ROM 1231 may include other static storage device(s) (e.g., programmable ROM, erasable PROM, and electrically erasable PROM). In addition, the system memory 1230 may be used for storing temporary variables or other intermediate information during the execution of instructions by the processors 1220. A basic input/output system (BIOS) 1233 containing the basic routines that help to transfer information between elements within computer system 1210, such as during start-up, may be stored in ROM 1231. RAM 1232 may contain data and/or program modules that are immediately accessible to and/or presently being operated on by the processors 1220. System memory 1230 may additionally include, for example, operating system 1234, application programs 1235, other program modules 1236 and program data 1237.

The computer system 1210 also includes a disk controller 1240 coupled to the system bus 1221 to control one or more storage devices for storing information and instructions, such as a hard disk 1241 and a removable media drive 1242 (e.g., floppy disk drive, compact disc drive, tape drive, and/or solid state drive). The storage devices may be added to the computer system 1210 using an appropriate device interface (e.g., a small computer system interface (SCSI), integrated device electronics (IDE), Universal Serial Bus (USB), or FireWire).

The computer system 1210 may also include a display controller 1265 coupled to the system bus 1221 to control a display 1266, such as a cathode ray tube (CRT) or liquid crystal display (LCD), for displaying information to a computer user. The computer system includes a user input interface 1260 and one or more input devices, such as a keyboard 1262 and a pointing device 1261, for interacting with a computer user and providing information to the processors 1220. The pointing device 1261, for example, may be a mouse, a trackball, or a pointing stick for communicating direction information and command selections to the processors 1220 and for controlling cursor movement on the display 1266. The display 1266 may provide a touch screen interface which allows input to supplement or replace the communication of direction information and command selections by the pointing device 1261.

The computer system 1210 may perform a portion or all of the processing steps of embodiments of the invention in response to the processors 1220 executing one or more sequences of one or more instructions contained in a memory, such as the system memory 1230. Such instructions may be read into the system memory 1230 from another computer readable medium, such as a hard disk 1241 or a removable media drive 1242. The hard disk 1241 may contain one or more datastores and data files used by embodiments of the present invention. Datastore contents and data files may be encrypted to improve security. The processors 1220 may also be employed in a multi-processing arrangement to execute the one or more sequences of instructions contained in system memory 1230. In alternative embodiments, hard-wired circuitry may be used in place of or in combination with software instructions. Thus, embodiments are not limited to any specific combination of hardware circuitry and software.

As stated above, the computer system 1210 may include at least one computer readable medium or memory for holding instructions programmed according to embodiments of the invention and for containing data structures, tables, records, or other data described herein. The term "computer readable medium" as used herein refers to any medium that participates in providing instructions to the processors 1220 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 1241 or removable media drive 1242. Non-limiting examples of volatile media include dynamic memory, such as system memory 1230. Non-limiting examples of transmission media include coaxial cables, copper wire, and fiber optics, including the wires that make up the system bus 1221. Transmission media may also take the form of acoustic or light waves, such as those generated during radio wave and infrared data communications.

The computing environment 1200 may further include the computer system 1210 operating in a networked environment using logical connections to one or more remote computers, such as remote computing device 1280. Remote computing device 1280 may be a personal computer (laptop or desktop), a mobile device, a server, a router, a network PC, a peer device or other common network node, and typically includes many or all of the elements described above relative to computer system 1210. When used in a networking environment, computer system 1210 may include modem 1272 for establishing communications over a network 1271, such as the Internet. Modem 1272 may be connected to system bus 1221 via user network interface 1270, or via another appropriate mechanism.

Network 1271 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1210 and other computers (e.g., remote computer 1280). The network 1271 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 1271.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method for producing an image of a subject using a magnetic resonance imaging (MRI) system, the method comprising:
   acquiring a series of echo signals by sampling k-space along radial lines that each pass through the center of k-space, wherein each projection of the radial lines is divided into multiple echoes and successive projections are spaced by a predetermined angular distance;
   reconstructing the series of echo signals into a plurality of images, wherein each image corresponds to a distinct echo signal;
   for each echo signal, calculating a proton resonance frequency temperature change in the subject using phase information from a first echo signal acquired in the series of echo signals as a reference phase.

2. The method of claim 1, wherein the predetermined angular distance is a pseudo golden angle.

3. The method of claim 1, wherein the predetermined angular distance is a factor that depends on the golden angle.

4. The method of claim 1, wherein the predetermined angular distance is a multiple of a Fibonacci number.

5. The method of claim 1, further comprising:
   calculating an initial signal magnitude value based on the series of echo signals; and
   calculating a transverse relaxation time value based on the series of echo signals.

6. The method of claim 1, wherein the series of projections comprises (i) a series of inner projections spaced according to a first angle corresponding to a ratio of a first Fibonacci number to a maximum Fibonacci number and (ii) a series of outer projections spaced according to a second angle corresponding to a ratio of a second Fibonacci number to the maximum Fibonacci number.

7. The method of claim 1, wherein the plurality of echo signals is reconstructed into a plurality of images using a k-space weighted image contrast (KWIC) reconstruction process.

8. The method of claim 7, wherein the KWIC reconstruction process uses a sliding window that advances over multiple projections for each echo signal.

9. The method of claim 8, wherein the sliding window is asymmetric in time and k-space center is reconstructed at the end of the sliding window.

10. The method of claim 1, further comprising:
    measuring a plurality of respiration phase offsets by linearly fitting the slope of the phase at k-space center from the series of echo signals as a function of TE using linear regression; and
    performing respiration correction on the series of echo signals using the plurality of respiration phase offsets.

11. The method of claim 10, wherein the MRI system comprises a plurality of coils that independently measure the slope and the method further comprises:
    averaging the slope of the phase across all of the coils over multiple respiratory cycles to obtain a baseline slope; and
    subtracting the baseline slope from the phase slope measured by each coil.

12. A method for performing thermometry using a magnetic resonance imaging (MRI) system, the method comprising:
    acquiring a series of echo signals by sampling k-space along each projection in a series of projections using a stack of stars sequence, wherein successive projections in the series of projections are spaced apart by an angular distance equal to a pseudo golden angle; and calculating proton resonance frequency temperature change in the subject using phase information from the series of echo signals.

13. The method of claim 12, further comprising:
reconstructing the plurality of echo signals into a plurality of images using a KWIC reconstruction process, wherein each image corresponds to a distinct echo signal.

14. The method of claim 13, wherein the KWIC reconstruction process uses a sliding window that advances over multiple projections for each echo signal and the sliding window is asymmetric in time and k-space center is reconstructed at the end of the sliding window.

15. The method of claim 12, wherein the proton resonance frequency temperature change is calculated independently for each echo signal using phase information from a first echo signal acquired in the series of echo signals as a reference phase.

16. The method of claim 12, wherein the proton resonance frequency temperature change is calculated independently for each echo signal using phase information corresponding to a reference signal acquired at the same rotation from k-space center as the echo signal as a reference phase.

17. The method of claim 12, wherein the proton resonance frequency temperature change is calculated across the series of echo signals using phase information from a first echo signal acquired in the series of echo signals.

18. The method of claim 12, wherein the proton resonance frequency temperature change is calculated across the series of echo signals and the proton resonance frequency temperature change for each individual echo signal is calculated using a reference signal acquired at the same rotation from k-space center as the individual echo signal as a reference phase.

19. The method of claim 12, further comprising:
calculating an initial signal magnitude value based on the series of echo signals; and
calculating a transverse relaxation time value based on the series of echo signals.

* * * * *